TRANSISTOR BIAS AND TEMPERATURE COMPENSATION CIRCUIT

Original Filed Dec. 21, 1964

INVENTOR
DANIEL R. von RECKLINGHAUSEN
BY Rines and Rines
ATTORNEYS 3,566,293
Patented Feb. 23, 1971

3,566,293

TRANSISTOR BIAS AND TEMPERATURE COMPENSATION CIRCUIT

Daniel R. von Recklinghausen, Arlington, Mass., assignor to H. H. Scott Inc., Maynard, Mass., a corporation of Massachusetts Continuation of application Ser. No. 419,888, Dec. 21, 1964. This application June 10, 1968, Ser. No. 735,805
Int. Cl. H03f *1/32, 3/04*
U.S. Cl. 330—23 5 Claims

ABSTRACT OF THE DISCLOSURE

A novel transistor amplifier bias and temperature compensation circuit is disclosed employing in the input circuit a current-division network one path of which embodies a diode or the like connected between the base and emitter of the amplifier.

This application is a continuation of Ser. No. 419,888, filed Dec. 21, 1964, now abandoned.

The present invention relates to transistor amplifier circuits, and more specifically to circuits adapted for automatic temperature compensation with simultaneous bias adjustment and flexibility for use with transistor amplifiers of different manufacturing tolerance characteristics, together with minimal external influence on further stages associated with the amplifiers.

Transistor amplifier circuits have previously been provided with variable bias input circuits employing potentiometers and other variable resistance devices, though most commonly no adjustable bias has been provided. Many of such devices, however, do not provide temperature compensation for variations in transistor properties with ambient temperature changes. Suggestions have accordingly been made to incorporate diodes and other negative temperature coefficient of resistance devices that, when subjected to the same ambient temperature variations as the transistor amplifier, will themselves exhibit resistance changes compensatory of the resistance changes effected in the transistor amplifier. While a measure of temperature compensation is thereby attained, these two-terminal negative temperature coefficient of resistance diodes and the like are not themselves adjustable for variation in their output which supplies transistor bias. That bias must, moreover, accommodate the relatively wide range of different characteristics of transistors introduced by the tolerances in manufacture of the same and in the use of transistors of different gain and other characteristics in the same circuit. Designers have accordingly usually chosen the lesser of the two disadvantageous results above-described in designing circuits of this character; namely, a diode or thermistor in an invariant circuit, selected in the laboratory with such a value as to represent a mean of the production variation encountered in practice.

In accordance with the present invention, it has been discovered that, through a novel circuit and rather simple adjustment of relative parameters, negative temperature coefficient of resistance devices such as silicon or other solid-state diodes or the like, preferably though not always essentially matched to the type of solid state material of the transistor amplifier, are, in effect, made variable in the sense that they can provide not only temperature-compensating effects in the input circuit of a transistor amplifier, but enable variation of the output thereof to satisfy the requirements of production variances in different transistor amplifiers; and, at the same time, through the employment of a constant-current circuit connection, can exert minimum influence on any previous or external amplifier circuits or loads associated with the transistor amplifier.

A further object of the invention is to provide a new and improved transistor amplifier.

Other and further objects will be explained hereinafter and will be more particularly pointed out in the appended claims.

It will be noted that transistors of wider tolerances and diodes or other two-terminal negative temperature coefficient of resistance devices of wider tolerances may thus be employed in amplifier circuits in accordance with the present invention than has heretofore been possible.

The invention will now be described in connection with the accompanying drawing:

FIG. 1 of which is a schematic circuit diagram of a single amplifier stage illustrating certain of the features of the invention;

Figure 1:
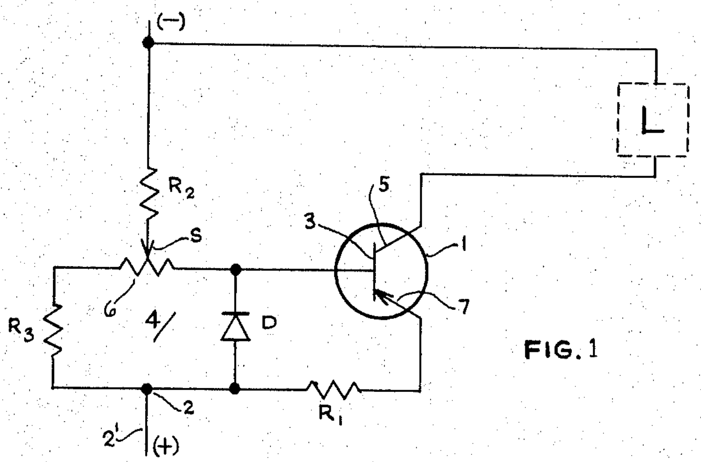

Referring to FIG. 1, a transistor amplifier is shown at 1 comprising a base electrode 3, a collector electrode 5 and an emitter electrode 7 that, in the illustrated embodiment, is connected (optionally) through a resistance $R_1$ to a terminal 2. The current supply for providing bias for the transistor amplifier stage 1 is shown at (−) and (+) respectively connected through a resistor $R_2$ and by a conductor 2' to the input circuit 4 between the base electrode 3 and the emitter electrode 7. The input circuit 4 is shown comprising an energy-divider variable resistance potentiometer 6 the slider S of which may introduce more or less resistance to the left or right thereof for the bias variation purpose before discussed and later more fully explained. The righthand terminal of the potentiometer 6 is shown connected to the base electrode 3 and to one side of a two-terminal negative temperature coefficient of resistance device D such as one of the solid state diodes beforementioned. The diode D or the other negative temperature coefficient of resistance device must operate in the forward or conducting mode to correspond to the nature of the operation of the junction between the base 3 and emitter 7 of the transistor amplifier 1. The other terminal of the diode D is shown connected to the terminal 2. The left-hand terminal of the potentiometer 6 moreover is preferably connected (though not essentially) through a resistance $R_3$ to the terminal 2 such that the elements 6–D–$R_3$ constitute the input circuit to the amplifier 1.

Figures 2, 3:
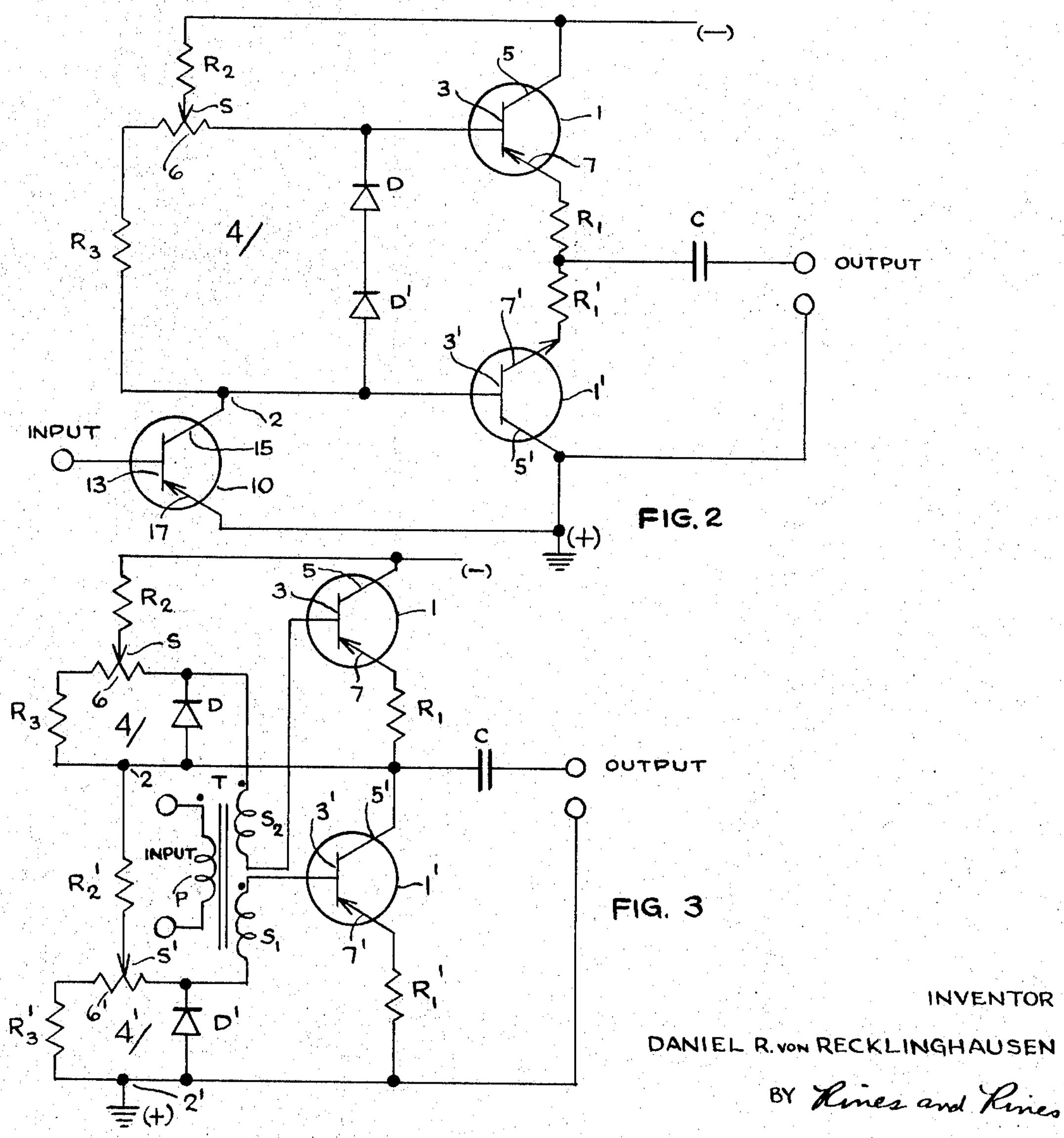
FIG. 2 is a similar diagram of a preferred modification.
FIG. 3 is a circuit diagram illustrating the invention employed in connection with a transformer input signal application means.

In accordance with the present invention, it has been found that if the value of the resistance $R_2$ in the path of the current being supplied from the terminal (−) to the input circuit 4 is made very large compared with the effective resistance presented to the current by the input circuit 4 (i.e. the resistance of the potentiometer 6 and the elements D and $R_3$, and the input impedance of the transistor between the base 3 and the terminal 2), that substantially constant current will flow through the input circuit 4 between the terminals (+) and (−) for a reason that will be more clearly evident in connection with the discussion of FIGS. 2 and 3. Succinctly stated, however, that reason resides in the desirability of exerting minimum influence on any circuit external to the amplifier 1.

Under the circumstances above set forth, with the collector 5 returned through some desired load L to the terminal (—), the temperature variations occurring in the transistor 1 will be compensated for by variations in the bias applied between the base 3 and the emitter 7 through corresponding temperature-produced variations in the diode D. In addition, effective variation in the output of the diode D through varying its effective resistance is provided by means of the movement of the potentiometer slider 5 in the constant current circuit between terminals (+) and (—) through the input circuit 4, such variation enabling the matching of the desired bias characteristics to transistors of wide ranges of differences in properties and production tolerances.

In the circuit of FIG. 2, similar input circuits are shown applied to a pair of push-pull transistors 1 and 1', there being two diodes D and D', both connected in the forward conducting mode for the reasons before discussed. The reason for two diodes resides in the fact that there are two junctions that must be temperature compensated; namely, the one between the base 3 and emitter 7 of the transistor stage 1 and the other between the base 3' and emitter 7' of the other push-pull stage 1'. The same relative values of the input circuit components, however, are required in the system of FIG. 2 to produce the results before stated. The diodes D and D' are effectively connected in the transistor amplifier input circuit between base and emitter electrodes, analogous to the connections of the single-ended amplifier of FIG. 1. The input signal applied to the bases of the push-pull amplifiers 1 and 1' is provided by an input stage 10 the collector current of which, applied from terminal 2 to the collector 15, is maintained constant by the constant current input supply before referred to. Minimum change in amplification or overload of the driver stage 10 to which the input signal is applied at the base 13 is thus attained by this constant current path, the emitter 17 being shown returned to the (+) or ground terminal in this circuit. Thus, minimum influence is exerted by the temperature compensation and variable bias circuit of the present invention upon external circuits. The output of the push-pull amplifier, which may, if desired, through appropriate operation of a slider S be operated anywhere from class A to class B or beyond, is shown taken through the coupling capacitor C and from the (+) or grounded terminal at the emitter 5'. One may, of course, substitute other combinations of stages that perform similar functions to the push-pull amplifier 1 and 1', if desired, including further stages associated in pairs or other multiples with the stages 1 and 1'.

While the circuit of FIG. 2 is shown comprising the driver transistor stage 10, furthermore, it is to be understood that other types of input circuits may also be beneficially employed with the invention such as the input push-pull transformer T of FIG. 3. The primary winding P of the transformer T receives the input signal and the secondary windings $S_1$ and $S_2$ are respectively connected between the base electrodes 3 and 3' and the respective upper terminals of the compensating diodes D and D'. The secondaries $S_1$ and $S_2$, as well as the other components of the circuits, will be substantially symmetrical unless assymetry is required in the bias connections on the similar potentiometers 6 and 6' to produce the balanced output. In FIG. 3, therefore, a pair of similar input circuits 4 and 4' is shown, the circuit 4' having the same circuit elements as the input circuit 4 but indicated with a prime notation.

In the circuit of FIG. 3, transistors of the same type such as, for example, NPN or PNP's may be used in both stages 1 and 1'; whereas in the circuit of FIG. 2, transistors of opposite characteristics such as NPN and PNP will be required for the respective stages 1 and 1'. To maintain symmetry of operation of the circuit of FIG. 3 at all operation levels and divide in half the supply voltage during no input signal and all signal conditions, the constant current result is attained simultaneously with providing the variable temperature sensitive diode or other device D, enabling not only temperature compensation but variation of the bias conditions to accommodate amplifiers 1 and 1' of varying parameters and characteristics. In conventional nominally class B push-pull amplifiers of this character, for example, the current through the bias networks may readily be several times the zero input signal current through the push-pull transistor. In accordance with the present invention, any change in the variation of the potentiometers 6 and 6' will not make any substantial change in the voltage division to any upper and lower stages. This insures that the bias of the output amplifier stages may be adjusted in such a manner so that minimum distortion in amplification results.

Further modifications will occur to those skilled in the art and all such are considered to fall within the spirit and scope of the invention as defined in the appended claims.

What is claimed is:

1. A transistor amplifier provided with base, emitter and collector electrodes and having, in combination, a negative temperature coefficient two-terminal resistive device connected between the base and emitter electrodes and disposed to be subjected to substantially the same temperature variations as the amplifier, a variable resistance element, means for connecting the said element with the said device to comprise an input circuit for the amplifier having a pair of parallel-connected branch paths, only one of which includes said device, means including a resistive path connected to said input circuit for applying bias current to said input circuit and to divide the current between the said branch paths of the said input circuit, the resistance of the said resistive path being large compared to the resistance of said input circuit in order to enable variation of the current through and hence the effective resistance of the said device, and thus enable variation of bias for the amplifier to be effected simultaneously with compensation for temperature variations in the amplifier and with substantially constant bias current through the said input circuit, said variable resistance element comprising means for controlling the proportion of the bias current passed through said parallel-connected paths, respectively, of said input circuit.

2. An amplifier as claimed in claim 1 and in which a further transistor amplifier and negative temperature coefficient of resistance device are provided connected as claimed in claim 1, the first-named and further amplifiers being connected in push-pull with their emitters connected together and with the first-named and further resistance devices connected in series between the base electrodes of the amplifiers.

3. A pair of amplifiers as claimed in claim 1, means for connecting the same in push-pull and means for applying signals to the same in push-pull.

4. A transistor amplifier provided with base, emitter and collector electrodes and having, in combination, a negative temperature coefficient two-terminal resistive device connected between the base and emitter electrodes and disposed to be subjected to substantially the same temperature variations as the amplifier, a current-divider network having a variable resistance element, means for connecting the said element with the said device to comprise an input circuit for the amplifier, means including a resistive path connected to said input circuit for applying bias current to pass the same through said element and through the said device of the said input circuit, the resistance of the said resistive path being large compared to the resistance of said input circuit in order to enable variation of the current through and hence the effective resistance of the said device, and thus enable variation of bias for the amplifier to be effected simultaneously with compensation for temperature variations in the amplifier and with substantially constant bias current through the said input circuit, said current-divider variable resistance element comprising a potentiometer, the terminals of which are connected to opposite terminals of said resistive device.

5. An amplifier as claimed in claim 4 and in which the said resistive device is a solid-state device of the same material as the said transistor amplifier.

References Cited

UNITED STATES PATENTS

| | | | |
|---|---|---|---|
| 3,050,644 | 8/1962 | Ironside | 330—24X |
| 3,302,124 | 1/1967 | Dix | 330—23 |

FOREIGN PATENTS

| | | | |
|---|---|---|---|
| 764,154 | 12/1956 | Great Britain | 330—24X |

OTHER REFERENCES

Herscher: Designing Transistor Power Amplifiers, Electronics, Apr. 11, 1958, pp. 96–99.

ROY LAKE, Primary Examiner

L. J. DAHL, Assistant Examiner

U.S. Cl. X.R.

330—22